United States Patent
Zhu et al.

(10) Patent No.: US 10,720,454 B2
(45) Date of Patent: Jul. 21, 2020

(54) MANUFACTURING METHOD FOR ARRAY SUBSTRATE AND LIQUID CRYSTAL DISPLAY DEVICE

(71) Applicant: Shenzhen China Star Optoelectronics Semiconductor Display Technology Co., Ltd., Shenzhen (CN)

(72) Inventors: Maoxia Zhu, Shenzhen (CN); Hongyuan Xu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/111,236

(22) Filed: Aug. 24, 2018

(65) Prior Publication Data

US 2019/0371832 A1  Dec. 5, 2019

Related U.S. Application Data

(63) Continuation of application No. PCT/CN2018/092069, filed on Jun. 21, 2018.

(30) Foreign Application Priority Data

Jun. 5, 2018  (CN) .......................... 2018 1 0570161

(51) Int. Cl.
*G02F 1/1362* (2006.01)
*H01L 27/12* (2006.01)
(Continued)

(52) U.S. Cl.
CPC ........ *H01L 27/1288* (2013.01); *G02F 1/1368* (2013.01); *H01L 21/0273* (2013.01);
(Continued)

(58) Field of Classification Search
CPC ..................................................... G02F 1/1368
See application file for complete search history.

(56) References Cited

U.S. PATENT DOCUMENTS 8,927,993 B2  1/2015  Jung et al.
2008/0213472 A1*  9/2008  Song ................. G02F 1/134363
427/162

(Continued)

FOREIGN PATENT DOCUMENTS

CN  101034262 A  9/2007
CN  101819362 A  9/2010
(Continued)

*Primary Examiner* — Sang V Nguyen

(57) ABSTRACT

The present disclosure provides a manufacturing method for an array substrate and a liquid crystal display device. The manufacturing method for an array substrate may include: providing a substrate; forming a thin film transistor device comprising a source and a drain on the substrate; covering a passivation layer, a blocking layer, and a photoresist layer on the thin film transistor device, sequentially; processing the photoresist layer to divide the blocking layer and the passivation layer into a first region and a second region corresponding to positions of an active area, and a third region corresponding to a position of the thin film transistor device. By the above-mentioned manufacturing method, on one hand, a number of mask processes may be reduced, and the manufacturing efficiency may be improved. On the other hand, peeling efficiency of the photoresist may be improved.

10 Claims, 6 Drawing Sheets

(51) Int. Cl.
*H01L 29/786* (2006.01)
*G02F 1/1368* (2006.01)
*H01L 21/027* (2006.01)

(52) U.S. Cl.
CPC ...... *H01L 27/1222* (2013.01); *H01L 27/1274* (2013.01); *H01L 29/78678* (2013.01); *G02F 2001/136236* (2013.01)

(56) References Cited

U.S. PATENT DOCUMENTS

| | | | | |
|---|---|---|---|---|
| 2009/0256155 | A1* | 10/2009 | Kim | G02F 1/136209 257/72 |
| 2010/0093122 | A1* | 4/2010 | Min | H01L 21/0272 438/30 |
| 2011/0292327 | A1* | 12/2011 | Lin | G02F 1/133504 349/113 |
| 2013/0248870 | A1* | 9/2013 | Jung | H01L 27/088 257/59 |
| 2018/0182787 | A1* | 6/2018 | Lu | H01L 21/31138 |
| 2018/0233598 | A1* | 8/2018 | Lu | H01L 29/78603 |
| 2019/0067340 | A1* | 2/2019 | Shu | H01L 27/1288 |

FOREIGN PATENT DOCUMENTS

| | | | |
|---|---|---|---|
| CN | 103117248 | A | 5/2013 |
| CN | 105679714 | A | 6/2016 |
| CN | 107104077 | A | 8/2017 |
| KR | 20090041032 | A | 4/2009 |

\* cited by examiner the photoresist layer may be exposed by a mask, to divide the blocking layer and the passivation layer into a plurality of the first regions and a plurality of the second regions alternately corresponding to the positions of the active area, and the third region corresponding to the position of the source or the drain of the thin film transistor device — 121 the exposed blocking layer in the third region may be etched to expose the passivation layer, and the exposed passivation layer may be etched to expose the source or the drain of the thin film transistor device — 122 the photoresist layer may be ashed partially, to expose the blocking layer in the first region and to reduce the thickness of the photoresist layer in the second region — 123 the exposed blocking layer in the first region may be etched to expose the passivation layer — 124

Fig. 4

MANUFACTURING METHOD FOR ARRAY SUBSTRATE AND LIQUID CRYSTAL DISPLAY DEVICE

CROSS-REFERENCE TO RELATED APPLICATIONS

The present application is a continuation-application of International (PCT) Patent Application No. PCT/CN2018/092069, filed on Jun. 21, 2018, which claims foreign priority of Chinese Patent Application No. 201810570161.2, filed on Jun. 5, 2018 in the State Intellectual Property Office of China, the entire contents of which are hereby incorporated by reference.

FIELD

The described embodiments relate to a display technology, and more particularly, to a manufacturing method for an allay substrate and a liquid crystal display device.

BACKGROUND

A Liquid Crystal display (LCD) is a widely used flat panel display, which mainly uses a liquid crystal switch to control an intensity of a backlight light field to realize a screen display.

The liquid crystal switch is generally manufactured by a thin film transistor (TFT). A TFT manufacturing process generally uses a plurality of masks. An excessive number of masks increase process cost, and also increase production time, which reduces production efficiency.

SUMMARY

The present disclosure provides a manufacturing method for an array substrate and a liquid crystal display device. On one hand, a number of mask processes may be reduced, and the manufacturing efficiency may be improved. On the other hand, peeling efficiency of the photoresist may be improved.

In order to solve the above-mentioned technical problem, a technical solution adopted by the present disclosure is to provide a manufacturing method for an array substrate comprising: providing a substrate; forming a gate, a gate insulating layer, an active layer, and a second conductive layer on the substrate, sequentially; patterning the second conductive layer to form a source and a drain; covering a passivation layer, a blocking layer, and a photoresist layer on the second conductive layer, sequentially; exposing the photoresist layer by a mask, to divide the blocking layer and the passivation layer into a plurality of first regions and a plurality of second regions alternately corresponding to positions of an active area, and a third region corresponding to a position of the source or the drain; wherein a thickness of the photoresist layer in the first region is less than a thickness of the photoresist layer in the second region, and the blocking layer is exposed in the third region; etching the exposed blocking layer in the third region to expose the passivation layer, and etching the exposed passivation layer to expose the source or the drain; ashing the photoresist layer partially, to expose the blocking layer in the first region and to reduce the thickness of the photoresist layer in the second region; etching the exposed blocking layer in the first region to expose the passivation layer; forming a first conductive layer, on a surface of the array substrate; wherein the first conductive layer contacts the exposed passivation layer in the first region, the photoresist layer in the second region, the exposed source or drain in the third region; and the first conductive layer in the first region and the first conductive layer in the second region are discontinuous; peeling the photoresist layer off.

In order to solve the above-mentioned technical problem, a technical solution adopted by the present disclosure is to provide a manufacturing method for an array substrate comprising: providing a substrate; forming a thin film transistor device comprising a source and a drain on the substrate; covering a passivation layer, a blocking layer, and a photoresist layer on the thin film transistor device, sequentially; processing the photoresist layer to divide the blocking layer and the passivation layer into a first region and a second region corresponding to positions of an active area, and a third region corresponding to a position of the thin film transistor device; wherein the passivation layer is exposed in the first region; a width of the blocking layer corresponding to the second region is less than a width of the photoresist layer corresponding to the second region; the source or the drain of the thin film transistor device in the third region are exposed; forming a first conductive layer on a surface of the array substrate; wherein the first conductive layer contacts the exposed passivation layer in the first region, the photoresist layer in the second region, the exposed source or drain in the third region; and the first conductive layer in the first region and the first conductive layer in the second region are discontinuous; peeling the photoresist layer off.

In order to solve the above-mentioned technical problem, a technical solution adopted by the present disclosure is to provide a liquid crystal display device comprising a display panel and a backlight; wherein the display panel comprises an array substrate, a color filter substrate, and a liquid crystal layer between the array substrate and the color filter substrate; wherein the array substrate is manufactured by a manufacturing method comprising: providing a substrate; forming a thin film transistor device comprising a source and a drain on the substrate; covering a passivation layer, a blocking layer, and a photoresist layer on the thin film transistor device, sequentially; processing the photoresist layer to divide the blocking layer and the passivation layer into a first region and a second region corresponding to positions of an active area, and a third region corresponding to a position of the thin film transistor device; wherein the passivation layer is exposed in the first region; a width of the blocking layer corresponding to the second region is less than a width of the photoresist layer corresponding to the second region; the source or the drain of the thin film transistor device in the third region are exposed; forming a first conductive layer on a surface of the array substrate; wherein the first conductive layer contacts the exposed passivation layer in the first region, the photoresist layer in the second region, the exposed source or drain in the third region; and the first conductive layer in the first region and the first conductive layer in the second region are discontinuous; peeling the photoresist layer off.

Advantages of the disclosure may follow. As compared with the related art, the present disclosure may provide a manufacturing method for an array substrate comprising: providing a substrate; forming a gate, a gate insulating layer, an active layer, and a second conductive layer on the substrate, sequentially; patterning the second conductive layer to form a source and a drain; covering a passivation layer, a blocking layer, and a photoresist layer on the second conductive layer, sequentially; exposing the photoresist layer by a mask, to divide the blocking layer and the passivation layer into a plurality of first regions and a plurality of second regions alternately corresponding to positions of an active area, and a third region corresponding to a position of the source or the drain; wherein a thickness of the photoresist layer in the first region is less than a thickness of the photoresist layer in the second region, and the blocking layer is exposed in the third region; etching the exposed blocking layer in the third region to expose the passivation layer, and etching the exposed passivation layer to expose the source or the drain; ashing the photoresist layer partially, to expose the blocking layer in the first region and to reduce the thickness of the photoresist layer in the second region; etching the exposed blocking layer in the first region to expose the passivation layer; forming a first conductive layer on a surface of the array substrate; wherein the first conductive layer contacts the exposed passivation layer in the first region, the photoresist layer in the second region, the exposed source or drain in the third region; and the first conductive layer in the first region and the first conductive layer in the second region are discontinuous; peeling the photoresist layer off. In an embodiment, the photoresist layer may be etched by only a mask, so that when a first conductive layer is formed, a part of the first conductive layer may be formed on the passivation layer, and the other part may be formed on the photoresist layer, and the two parts of the first conductive layer may be discontinuous. Therefore, after the photoresist layer is peeled off, the first conductive layer arranged and spaced apart may be formed. On one hand, a number of mask processes may be reduced, and the manufacturing efficiency may be improved. On the other hand, peeling efficiency of the photoresist may be improved.

BRIEF DESCRIPTION OF THE DRAWINGS

In order to clearly illustrate the technical solutions of the present disclosure, the drawings used in the description of the embodiments will be briefly described. It is understood that the drawings described herein are merely some embodiments of the present disclosure. Those skilled in the art may derive other drawings from these drawings without inventive effort.

FIG. 4 is a flow chart for block 12 of a manufacturing method for an array substrate in accordance with an embodiment in the present disclosure.

DETAILED DESCRIPTION

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

The terms "first", "second", and the like in the present application are used to distinguish different objects, and are not intended to describe a particular order. Furthermore, the terms "comprise" and "include" and the like are intended to cover a non-exclusive inclusion. For example, a process, a method, a system, a product, or a device that comprises a series of steps or units is not limited to the listed steps or units, but also alternatively includes steps or units not listed, or, other steps or units inherent to these processes, methods, products or equipment.

References to "an embodiment" herein mean that a particular feature, a structure, or a characteristic described in connection with the embodiments may be included in at least one embodiment of the present application. The appearances of the phrases in various places in the specification are not necessarily referring to the same embodiments, and are not exclusive or alternative embodiments that are mutually exclusive. Those skilled in the art will understand and implicitly understand that the embodiments described herein may be combined with other embodiments.

Figure 1:
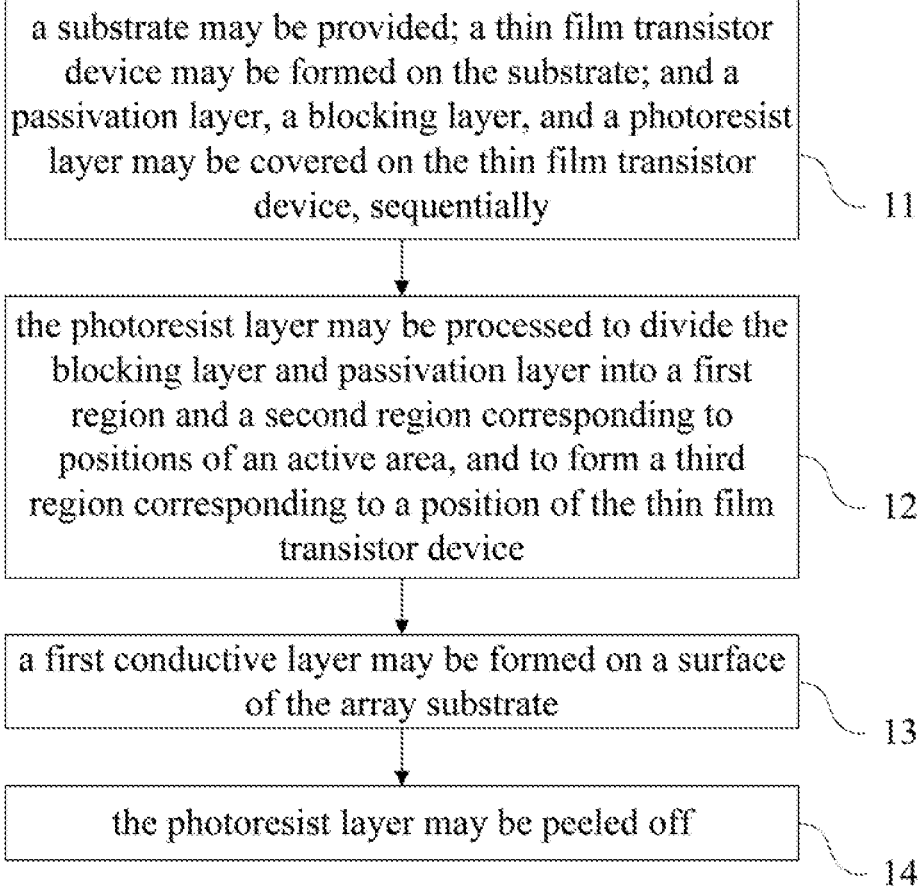
FIG. 1 is a flow chart of a manufacturing method for an array substrate in accordance with an embodiment in the present disclosure.

Referring to FIG. 1, FIG. 1 is a flow chart of a manufacturing method for an array substrate in accordance with an embodiment in the present disclosure. The manufacturing method may comprise the following blocks.

Block 11: a substrate may be provided; a thin film transistor device may be formed on the substrate; and a passivation layer, a blocking layer, and a photoresist layer may be covered on the thin film transistor device, sequentially.

Figure 2:
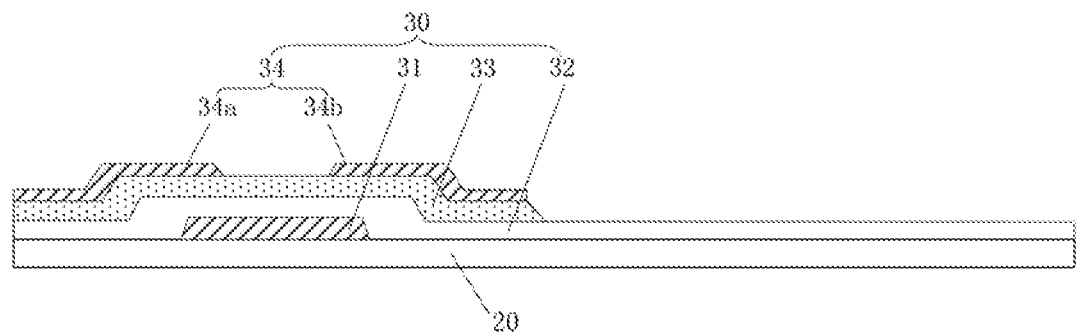
FIG. 2 is a structural illustration for block 11 of a manufacturing method for an array substrate in accordance with an embodiment in the present disclosure.

As shown in FIG. 2, a thin film transistor device 30 may be manufactured on a substrate 20. The thin film transistor device 30 may include a gate 31, a gate insulating layer 32, an active layer 33, and a source or drain layer 34 arranged sequentially. The source or drain layer 34 may include a source 34a and a drain 34b.

Take a manufacturing process for the thin film transistor device 30 for an example to describe.

Optionally, a metal layer may be first deposited on the substrate 20, such as chromium (Cr), chromium alloy, molybdenum tantalum (MoTa) alloy, aluminum (Al), or aluminum alloy. The metal layer may be patterned, and then the gate 31 may be formed.

An insulating material may be deposited on the gate 31 to form a gate insulating layer 32. The insulating material may be silicon oxide (SiOx), silicon nitride (SiNx), or aluminium monoxide (AlO), and the like. In addition, the gate insulating layer 32 may also be a two-layer structure. A first layer of the two-layer structure may be SiOx, SiNx, or AlO, and a second layer of the two-layer structure may be SiNx.

A semiconductor material may be deposited on the gate insulating layer 32 to form the active layer 33. Optionally, a layer of amorphous silicon may be deposited first, and then the amorphous silicon may be subjected to a high temperature excimer laser annealing (ELA) treatment, to convert the amorphous silicon into polycrystalline silicon, and then the polycrystalline silicon may be doped to form the active layer 33. A middle portion of the polysilicon may be lightly doped, and two side portions of the polysilicon may be heavily doped, so that the heavily doped portions may further be form a source and a drain.

A metal layer which may be made of a metal such as aluminum (Al) alloy, aluminum, chromium (Cr), or the like, may be further deposited on the active layer 33, and after the metal layer is patterned, the source 34a and the drain 34b may be formed.

It should be noticed that, the above-mentioned manufacturing process for the thin film transistor device 30 is merely an example. In other embodiments, the thin film transistor device may be other structures, for example, a top gate type.

Figure 3:
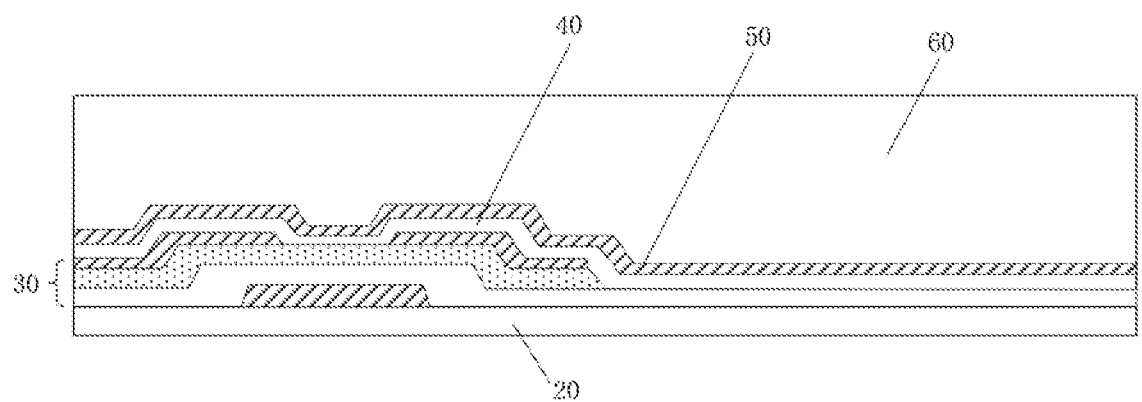
FIG. 3 is another structural illustration for block 11 of a manufacturing method for an array substrate in accordance with an embodiment in the present disclosure.

As shown in FIG. 3, after the thin film transistor device 30 is manufactured, a passivation layer 40, a blocking layer 50, and a photoresist layer 60 may be sequentially arranged on the thin film transistor device 30.

The passivation layer 40 may be made of an inorganic insulating material or an organic insulating material, such as SiOx, SiNx, and the like. The blocking layer 50 may be made of metal, such as molybdenum (Mo), titanium (Ti), or molybdenum titanium (MoTi) alloy. The photoresist layer 60 may be made of a photosensitive material. The photosensitive material is called photo resistance (PR), which may have a unique property. Under an irradiation of ultraviolet (UV) light, a chemical change may occur and may become a new substance that may be soluble in acid solution or alkali solution. Therefore, in an embodiment, the passivation layer 40 and the blocking layer 50 may be patterned by the photoresist layer 60 which processed to be a new shape.

Block 12: the photoresist layer may be processed to divide the blocking layer and passivation layer into a first region and a second region corresponding to positions of an active area, and a third region corresponding to a position of the thin film transistor device.

The passivation layer may be exposed in the first region. A width of the blocking layer corresponding to the second region may be less than a width of the photoresist layer corresponding to the second region. The source or the drain of the thin film transistor device in the third region may be exposed.

Optionally, in an embodiment, the above-mentioned first region, the second region, and the third region may be manufactured by the following blocks. As shown in FIG. 4, the blocks may include:

Block 121: the photoresist layer may be exposed by a mask, to divide the blocking layer and the passivation layer into a plurality of the first regions and a plurality of the second regions alternately corresponding to the positions of the active area, and the third region corresponding to the position of the source or the drain of the thin film transistor device.

A thickness of the photoresist layer in the first region may be less than a thickness of the photoresist layer in the second region, and the blocking layer may be exposed in the third region.

Figure 5:
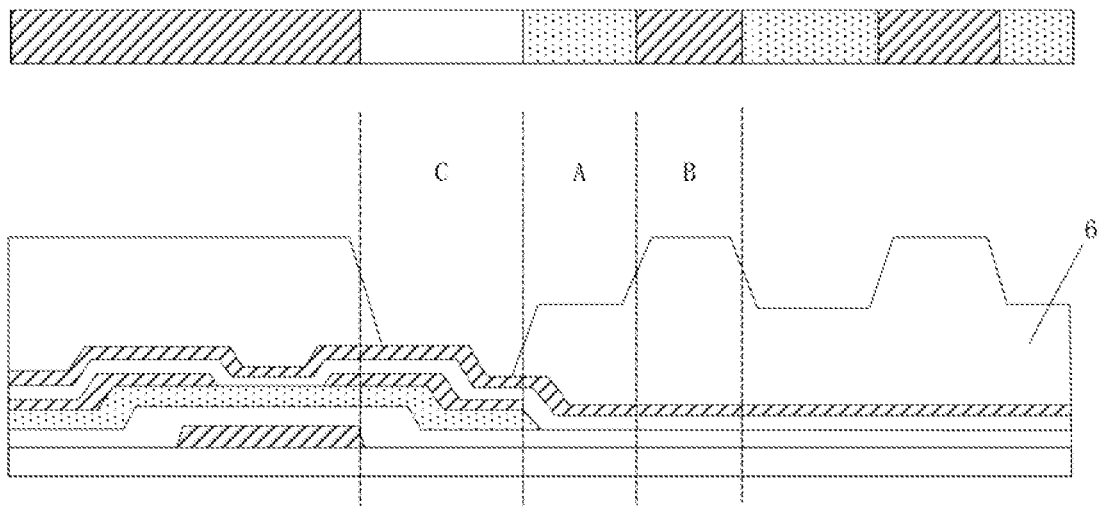
FIG. 5 is a structural illustration for block 121 of a manufacturing method for an array substrate in accordance with an embodiment in the present disclosure.

As showing FIG. 5, in an embodiment, the first region may be indicated by an A region, the second region may be indicated by a B region, and the third region may be indicated by a C region. In an embodiment, it may be only necessary to use a mask to complete the exposing process to form different thicknesses of different photoresist regions, e.g., a half tone mask (HTM) may be used. The mask corresponding to the A region may be a semi-light transmitting region; the mask corresponding to the B region may be a non-light transmitting region; and the mask corresponding to the C region may be a transmitting region. When the mask is irradiated by the UV light, the light may pass through the transmitting region (corresponding to the C area) totally, and the light may pass through the semi-light transmitting region (corresponding to the A area) partially, and the light may be blocked by the non-light transmitting region (corresponding to the B area).

By the above-mentioned mask, different regions of the photoresist layer 60 may be irradiated with different degrees of light, so that degrees of chemical reaction of the photoresist material may be different to form different thicknesses of the photoresist layer 60. In a subsequent photoresist peeling process, portions where the chemical reaction of the photoresist material occurs may be peeled, and thicknesses of the remaining photoresist layer 60 may be different in different regions. As shown in FIG. 5, the thickness of the photoresist corresponding to the A region may be less than the thickness of the photoresist corresponding to the B region, and the photoresist corresponding to the C region may be completely peeled off, and the underlying blocking layer 50 may be exposed.

Block 122: the exposed blocking layer in the third region may be etched to expose the passivation layer, and the exposed passivation layer may be etched to expose the source or the drain of the thin film transistor device.

Figure 6:
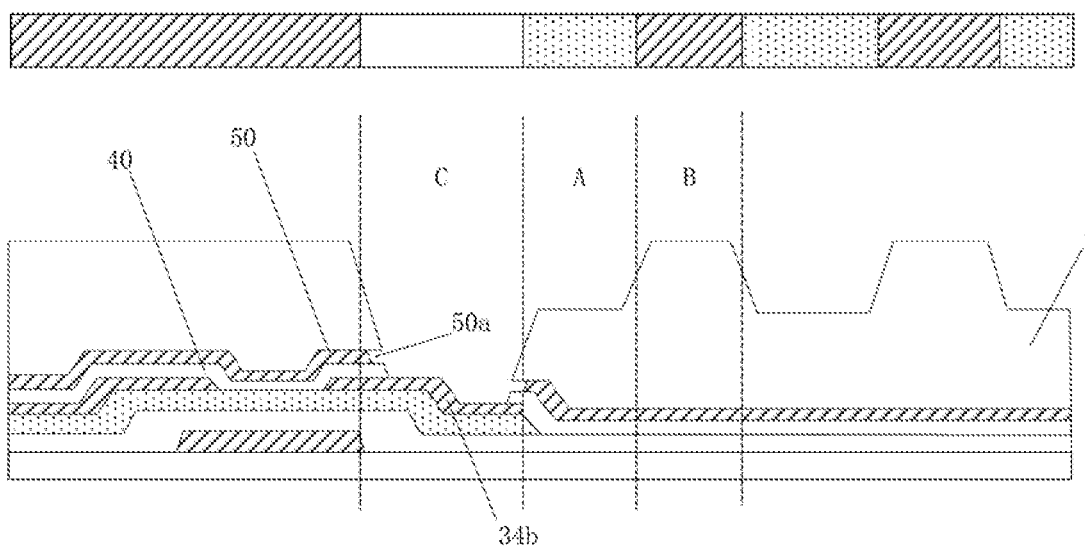
FIG. 6 is a structural illustration for block 122 of a manufacturing method for an array substrate in accordance with an embodiment in the present disclosure.

As shown in FIG. 6, an etching method may be determined according to materials of the blocking layer 50 and the passivation layer 40. In an embodiment, the blocking layer 50 may be made of a metal material, and the passivation layer 40 may be made of an organic material, so that block 122 may include:

The exposed blocking layer 50 in the third region may be etched by a wet etching method to expose the passivation layer 40, and then the exposed passivation layer 40 in the third region may be etched by a dry etching method to expose the source or the drain of the thin film transistor device.

Because the blocking layer 50 may be etched by the wet etching method, etchant may be further etched laterally during the etching process, so as to form a notch 50a as shown in FIG. 6. In additional, when the passivation layer 40 is etched by the dry etching method, it may adopt to use etching gas. In an embodiment, after the passivation layer 40 is etched, the drain 34b may be exposed to be subsequently connected to a pixel electrode.

Block 123: the photoresist layer may be ashed partially, to expose the blocking layer in the first region and to reduce the thickness of the photoresist layer in the second region.

Figure 7:
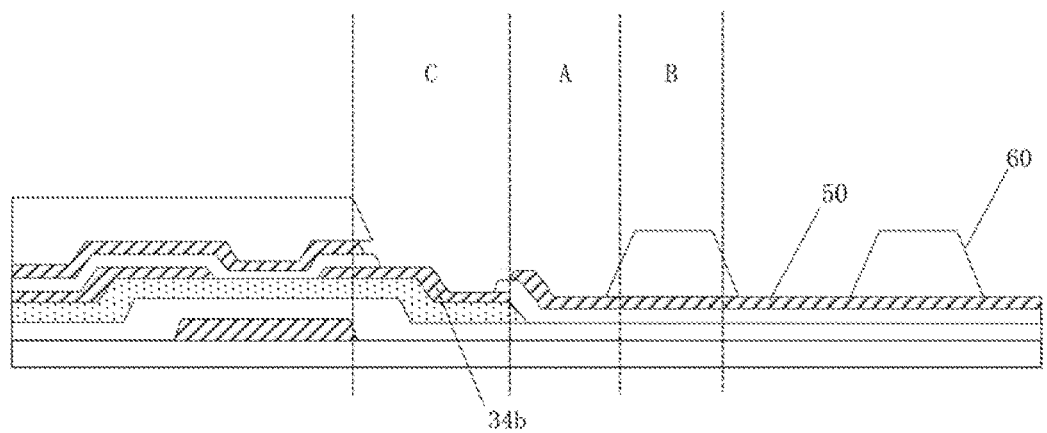
FIG. 7 is a structural illustration for block 123 of a manufacturing method for an array substrate in accordance with an embodiment in the present disclosure.

As shown in FIG. 7, the photoresist layer 60 may be ashed to make the thickness of the photoresist layer thin. After block 121, the thickness of the photoresist in the A region may be smaller than the thickness of the photoresist in the B region. Therefore, in block 123, it may be necessary to completely ash the photoresist in the thinner A region, thereby the underlying blocking layer 50 may be exposed, and the photoresist in the B region may also become thinner.

Block 124: the exposed blocking layer in the first region may be etched to expose the passivation layer.

Figure 8:
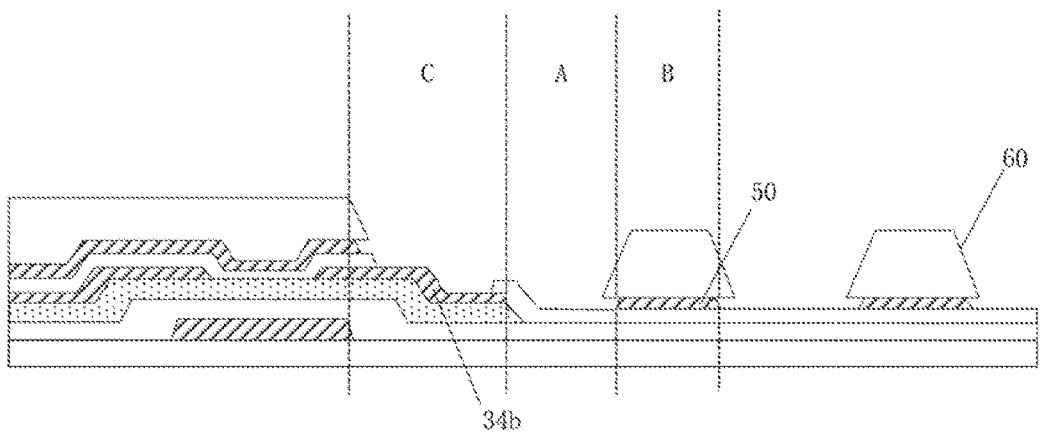
FIG. 8 is a structural illustration for block 124 of a manufacturing method for an array substrate in accordance with an embodiment in the present disclosure.

As shown in FIG. 8, the exposed blocking layer 50 may be etched in the first region by the wet etching method, and the blocking layer 50 in the second region may be etched by a lateral wet etching method, so that a width of the blocking layer 50 corresponding to the second region may be less than a width of the photoresist layer 60 corresponding to the second region.

Similar to the etching of the blocking layer 50 in the above-mentioned block 122, the etchant may also etch the blocking layer 50 in the lateral direction, so that the width of the blocking layer 50 may be less than the width of the photoresist layer 60 in the second region where the blocking layer 50 and the photoresist layer 60 are in contact.

Block 13: a first conductive layer may be formed on a surface of the array substrate.

The first conductive layer may contact the exposed passivation layer in the first region, the photoresist layer in the second region, the exposed source or drain in the third region. The first conductive layer in the first region and the first conductive layer in the second region may be discontinuous.

Figure 9:
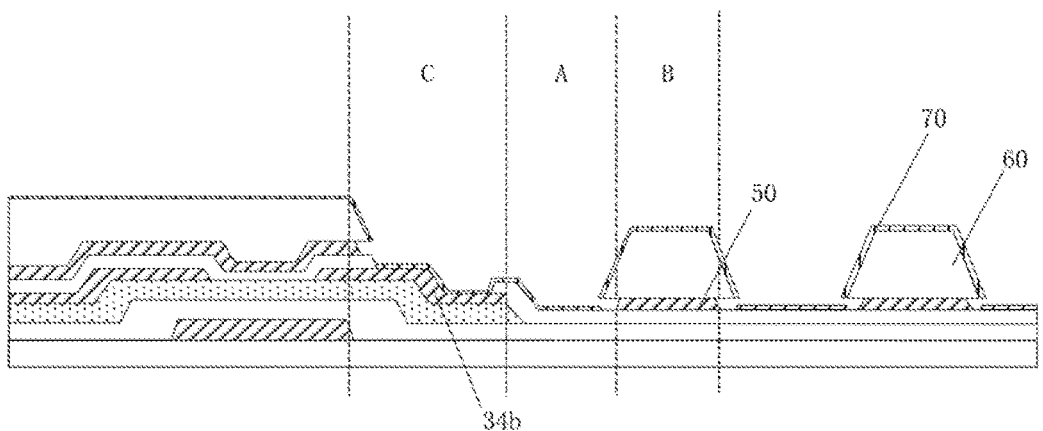
FIG. 9 is a structural illustration for block 13 of a manufacturing method for an array substrate in accordance with an embodiment in the present disclosure.

As shown in FIG. 9, the above-mentioned description that the first conductive layer 70 may be formed on the surface of the array substrate, may refer that the array substrate is manufactured after block 12, and the first conductive layer 70 may be located on the photoresist corresponding to the thin film transistor device, on the exposed drain 34b in the C region, on the exposed passivation layer 40 in the A region, and on the photoresist in the B region.

Because the blocking layer 50 may be etched by the wet etching method, the photoresist layer 60 and the passivation layer 40 may be discontinuous in the C region, or the photoresist layer 60 and the drain 34b may be discontinuous in the C region. There may be notches between the photoresist layer 60 and the passivation layer 40, or between the photoresist layer 60 and the drain 34b. In addition, at a junction of the A region and the B region, the passivation layer 40 and the photoresist layer 60 may be also discontinuous. Therefore, when the first conductive layer 70 is formed, the notch may be formed at a discontinuous position, e.g., the first conductive layer 70 on the photoresist layer 60 above the thin film transistor device and the first conductive layer 70 on the drain 34b may be discontinuous, and the first conductive layer 70 in the A region and the first conductive layer 70 in B region above the photoresist layer 60 may be discontinuous.

Block 14: the photoresist layer may be peeled off.

Figure 10:
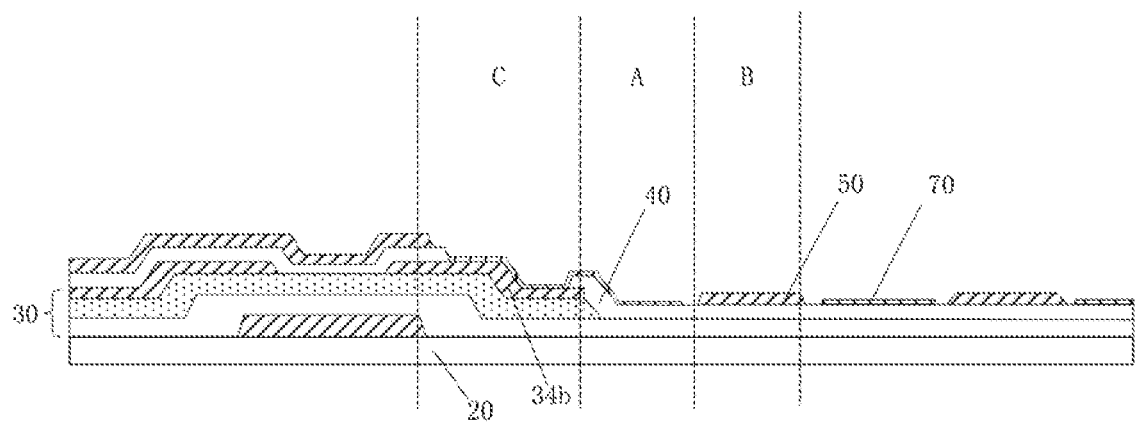
FIG. 10 is a structural illustration for block 14 of a manufacturing method for an array substrate in accordance with an embodiment in the present disclosure.

As shown in FIG. 10, after the photoresist layer is peeled off, the blocking layer 50 may be left on the thin film transistor device, and the first conductive layer 70 may be left on the drain 34b corresponding to the thin film transistor device and on the first region (i.e., the A region), and the blocking layer 50 may be left on the second region (i.e., the B region).

The first conductive layer 70 may be made of indium tin oxide (ITO) and be used as a pixel electrode of a display panel. Because a function of the pixel electrode may be to form an electric field with the common electrode to control a deflection of liquid crystal molecules, the pixel electrode may be formed as a plurality of strip electrodes spaced apart, and a shape of the pixel electrode is not limited herein. Therefore, it may be necessary to form a part of ITO on the photoresist layer, and when the photoresist layer is peeled off, the part of the ITO may be removed.

In addition, because the exposed blocking layer 50 may be made of metal, the blocking layer 50 may be oxidized in order to prevent a contact with the blocking layer 50 and the liquid crystal molecules from affecting a performance of the liquid crystal.

As compared with the related art, the present disclosure may provide a manufacturing method for an array substrate comprising: providing a substrate; forming a gate, a gate insulating layer, an active layer, and a second conductive layer on the substrate, sequentially; patterning the second conductive layer to form a source and a drain; covering a passivation layer, a blocking layer, and a photoresist layer on the second conductive layer, sequentially; exposing the photoresist layer by a mask, to divide the blocking layer and the passivation layer into a plurality of first regions and a plurality of second regions alternately corresponding to positions of an active area, and a third region corresponding to a position of the source or the drain; wherein a thickness of the photoresist layer in the first region is less than a thickness of the photoresist layer in the second region, and the blocking layer is exposed in the third region; etching the exposed blocking layer in the third region to expose the passivation layer, and etching the exposed passivation layer to expose the source or the drain; ashing the photoresist layer partially, to expose the blocking layer in the first region and to reduce the thickness of the photoresist layer in the second region; etching the exposed blocking layer in the first region to expose the passivation layer; forming a first conductive layer on a surface of the array substrate; wherein the first conductive layer contacts the exposed passivation layer in the first region, the photoresist layer in the second region, the exposed source or drain in the third region; and the first conductive layer in the first region and the first conductive layer in the second region are discontinuous; peeling the photoresist layer off. In an embodiment, the photoresist layer may be etched by only a mask, so that when a first conductive layer is formed, a part of the first conductive layer may be formed on the passivation layer, and the other part may be formed on the photoresist layer, and the two parts of the first conductive layer may be discontinuous. Therefore, after the photoresist layer is peeled off, the first conductive layer arranged and spaced apart may be formed. On one hand, a number of mask processes may be reduced, and the manufacturing efficiency may be improved. On the other hand, peeling efficiency of the photoresist may be improved.

Figure 11:
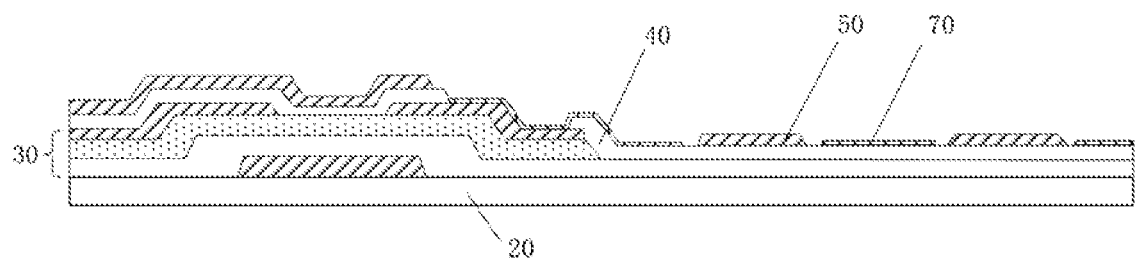
FIG. 11 is a structural illustration of an array substrate in accordance with an embodiment in the present disclosure.

Referring to FIG. 11, FIG. 11 is a structural illustration of an array substrate in accordance with an embodiment in the present disclosure. The array substrate may include a substrate 20, a thin film transistor device 30, and a passivation layer 40 stacked sequentially. The passivation layer 40 may define a through hole corresponding to a source or a drain of the thin film transistor device 30 to expose the source or the drain.

In addition, a plurality of first conductive layers 70 spaced apart may be further arranged on a position of the passivation layer 40 corresponding to an active area of the array substrate. Manufacturing for the array substrate in an embodiment may be same as the above-mentioned manufacturing method, therefore no additional description is given herein.

Figure 12:
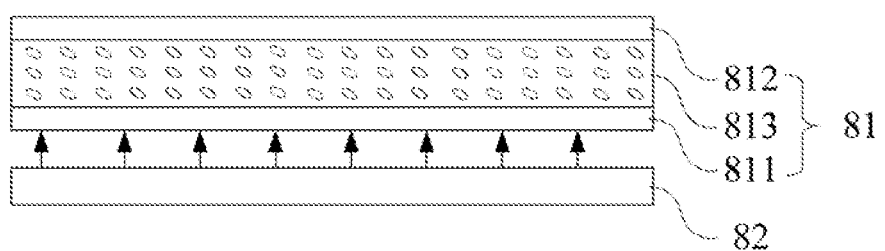
FIG. 12 is a structural illustration of a liquid crystal display device in accordance with an embodiment in the present disclosure.

Referring to FIG. 12, FIG. 12 is a structural illustration of a liquid crystal display device in accordance with an embodiment in the present disclosure. The liquid crystal display device may include a display panel 81 and a backlight 82. The display panel 81 may include an array substrate 811, a color filter substrate 812, and a liquid crystal layer 813 between the array substrate 811 and the color filter substrate 812.

The array substrate 811 may be an array substrate provided in the above-mentioned embodiment of FIG. 11.

In addition, the color filter substrate 812 may include a color filter and a common electrode layer, and an electric field may be formed between the common electrode layer and a pixel electrode layer formed by a first conductive layer on the array substrate 811, so that a deflection of the liquid crystal molecules in the liquid crystal layer 813 may be controlled.

In an embodiment, the liquid crystal display device may adopt the above-mentioned manufacturing method to be manufactured. On one hand, a number of mask processes may be reduced, and the manufacturing efficiency may be improved. On the other hand, peeling efficiency of the photoresist may be improved.

It is understood that the descriptions above are only embodiments of the present disclosure. It is not intended to limit the scope of the present disclosure. Any equivalent transformation in structure and/or in scheme referring to the instruction and the accompanying drawings of the present disclosure, and direct or indirect application in other related technical field, are included within the scope of the present disclosure.

What is claimed is:

1. A manufacturing method for an array substrate comprising:
   providing a substrate;
   forming a gate, a gate insulating layer, an active layer, and a second conductive layer on the substrate, sequentially;
   patterning the second conductive layer to form a source and a drain;
   covering a passivation layer, a blocking layer, and a photoresist layer on the second conductive layer, sequentially;
   exposing the photoresist layer by a mask, to divide the blocking layer and the passivation layer into a plurality of first regions and a plurality of second regions alternately corresponding to positions of an active area, and a third region corresponding to a position of the source or the drain;
   wherein a thickness of the photoresist layer in the first region is less than a thickness of the photoresist layer in the second region, and the blocking layer is exposed in the third region;
   etching the exposed blocking layer in the third region to expose the passivation layer, and etching the exposed passivation layer to expose the source or the drain;
   ashing the photoresist layer partially, to expose the blocking layer in the first region and to reduce the thickness of the photoresist layer in the second region;
   etching the exposed blocking layer in the first region to expose the passivation layer;
   forming a first conductive layer on a surface of the array substrate; wherein the first conductive layer contacts the exposed passivation layer in the first region, the photoresist layer in the second region, the exposed source or drain in the third region; and the first conductive layer in the first region and the first conductive layer in the second region are discontinuous;
   peeling the photoresist layer off;
   wherein the blocking layer is made of metal; and the etching the exposed blocking layer in the first region to expose the passivation layer, comprises:
   etching the exposed blocking layer in the first region by a wet etching method, and etching the blocking layer in the second region by a lateral wet etching method, so that a width of the blocking layer corresponding to the second region is less than a width of the photoresist layer corresponding to the second region.

2. The manufacturing method according to claim 1, wherein the mask comprises a light transmitting region, a non-light transmitting region, and a semi-light transmitting region, wherein the semi-light transmitting region corresponds to the first region, the non-light transmitting region corresponds to the second region, and the light transmitting corresponds to the third region.

3. The manufacturing method according to claim 1, wherein the blocking layer is made of metal; and the etching the exposed blocking layer in the third region to expose the passivation layer and etching the exposed passivation layer to expose the source or the drain, comprises:
   etching the exposed blocking layer in the third region by the wet etching method to expose the passivation layer;
   etching the exposed passivation layer in the third region by a dry etching method to expose the source or the drain.

4. The manufacturing method according to claim 3, after the peeling the photoresist layer off, further comprising:
   oxidizing the exposed blocking layer.

5. A manufacturing method for an array substrate comprising:
   providing a substrate;
   forming a thin film transistor device comprising a source and a drain on the substrate;
   covering a passivation layer, a blocking layer, and a photoresist layer on the thin film transistor device, sequentially;
   processing the photoresist layer to divide the blocking layer and the passivation layer into a first region and a second region corresponding to positions of an active area, and a third region corresponding to a position of the thin film transistor device; wherein the passivation layer is exposed in the first region; a width of the blocking layer corresponding to the second region is less than a width of the photoresist layer corresponding to the second region; the source or the drain of the thin film transistor device in the third region are exposed;
   forming a first conductive layer on a surface of the array substrate; wherein the first conductive layer contacts the exposed passivation layer in the first region, the photoresist layer in the second region, the exposed source or drain in the third region; and the first conductive layer in the first region and the first conductive layer in the second region are discontinuous;
   peeling the photoresist layer off;
   wherein the processing the photoresist layer to divide the blocking layer and passivation layer into the first region and the second region corresponding to the positions of the active area, and the third region corresponding to the position of the thin film transistor device, comprises:
   exposing the photoresist layer by a mask, to divide the blocking layer and passivation layer into a plurality of the first regions and a plurality of the second regions alternately corresponding to the positions of the active area, and the third region corresponding to the position of the source or the drain of the thin film transistor device; wherein a thickness of the photoresist layer in the first region is less than a thickness of the photoresist layer in the second region, and the blocking layer is exposed in the third region;
   etching the exposed blocking layer in the third region to expose the passivation layer, and etching the exposed passivation layer to expose the source or the drain of the thin film transistor device;

ashing the photoresist layer partially, to expose the blocking layer in the first region and to reduce the thickness of the photoresist layer in the second region;

etching the exposed blocking layer in the first region to expose the passivation layer;

wherein the blocking layer is made of metal; and the etching the exposed blocking layer in the first region to expose the passivation layer, comprises:

etching the exposed blocking layer in the first region by a wet etching method, and etching the blocking layer in the second region by a lateral wet etching method, so that a width of the blocking layer corresponding to the second region is less than a width of the photoresist layer corresponding to the second region.

6. The manufacturing method according to claim 5, wherein the mask comprises a light transmitting region, a non-light transmitting region, and a semi-light transmitting region, wherein the semi-light transmitting region corresponds to the first region, the non-light transmitting region corresponds to the second region, and the light transmitting corresponds to the third region.

7. The manufacturing method according to claim 5, wherein the blocking layer is made of metal; and the etching the exposed blocking layer in the third region to expose the passivation layer, and etching the exposed passivation layer to expose the source or the drain of the thin film transistor device, comprises:

etching the exposed blocking layer in the third region by the wet etching method to expose etching the exposed passivation layer in the third region by a dry etching method to expose the source or the drain of the thin film transistor device.

8. The manufacturing method according to claim 7, after the peeling the photoresist layer off, further comprising:

oxidizing the exposed blocking layer.

9. The manufacturing method according to claim 5, before the forming the thin film transistor device comprising the source and the drain on the substrate, covering the passivation layer, the blocking layer, and the photoresist layer on the thin film transistor device, further comprising:

forming a gate, a gate insulating layer, an active layer, and a second conductive layer on the substrate, sequentially;

patterning the second conductive layer to form the source and the drain.

10. The manufacturing method according to claim 5, wherein the first conductive layer is made of indium tin oxide.

* * * * *